(12) United States Patent
Bollesen

(10) Patent No.: US 6,211,566 B1
(45) Date of Patent: Apr. 3, 2001

(54) METHOD AND APPARATUS TO IMPROVE THE THERMAL INTERFACE BETWEEN A HEAT SINK AND A SEMICONDUCTOR

(75) Inventor: Vernon P. Bollesen, Milpitas, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/046,717

(22) Filed: Mar. 24, 1998

(51) Int. Cl.[7] ................................................. H01L 23/34
(52) U.S. Cl. ........................ 257/707; 257/713; 257/718; 361/704
(58) Field of Search ................................... 257/712, 713, 257/723, 724, 725, 706, 707, 717, 718, 719, 720; 438/122; 361/704

(56) References Cited

U.S. PATENT DOCUMENTS

| 4,254,431 | * | 3/1981 | Babuka et al. ........................ 257/713 |
| 5,247,426 | | 9/1993 | Hamburgen et al. . |
| 5,288,203 | | 2/1994 | Thomas . |
| 5,466,970 | * | 11/1995 | Smithers ............................... 257/712 |
| 5,654,876 | * | 8/1997 | Sathe et al. ........................... 361/704 |
| 5,841,633 | * | 11/1998 | Haung ................................... 361/695 |
| 5,978,223 | * | 11/1999 | Hamilton et al. ..................... 361/704 |

* cited by examiner

*Primary Examiner*—Olik Chaudhuri
*Assistant Examiner*—Alonzo Chambliss
(74) *Attorney, Agent, or Firm*—William S. Galliani; Pennie & Edmonds LLP

(57) ABSTRACT

A method and apparatus improve the thermal interface between a heat sink and a semiconductor. A support member is attached to a bias plate to facilitate a fixed connection with a surface. The bias plate has a beam for alignment with a heat sink that is attached to the semiconductor. The bias plate is attached to the support member such that the support member forces the beam against the heat sink to improve the thermal interface between the heat sink and the semiconductor.

In the method, a heat sink is attached to a semiconductor, and a pivoting beam is biased against the heat sink such that the thermal interface with the semiconductor is improved.

16 Claims, 7 Drawing Sheets

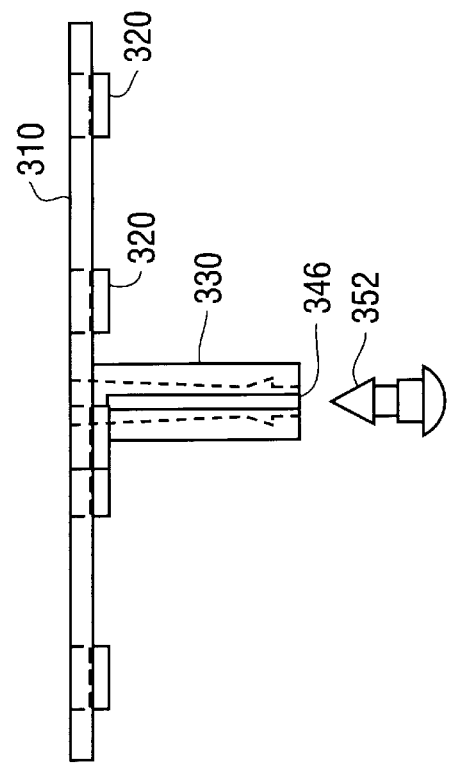
FIG. 3
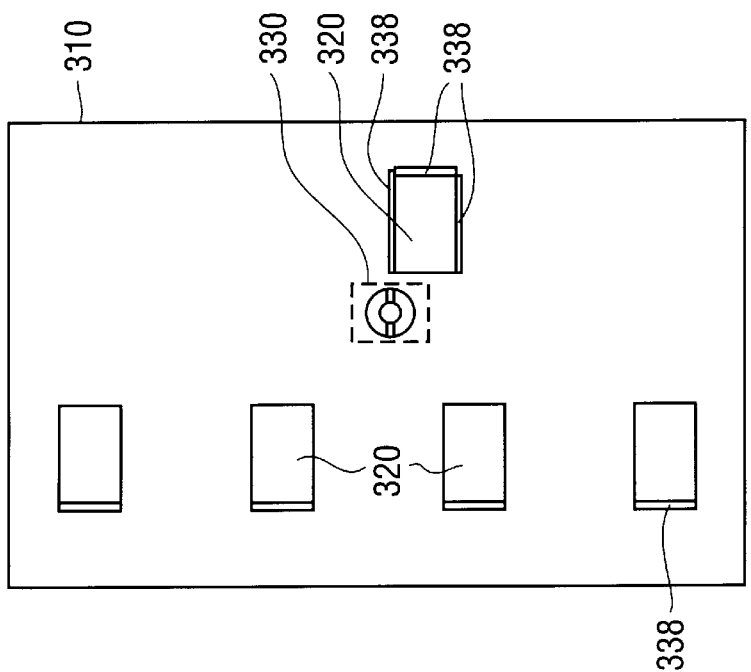
FIG. 4
FIG. 5

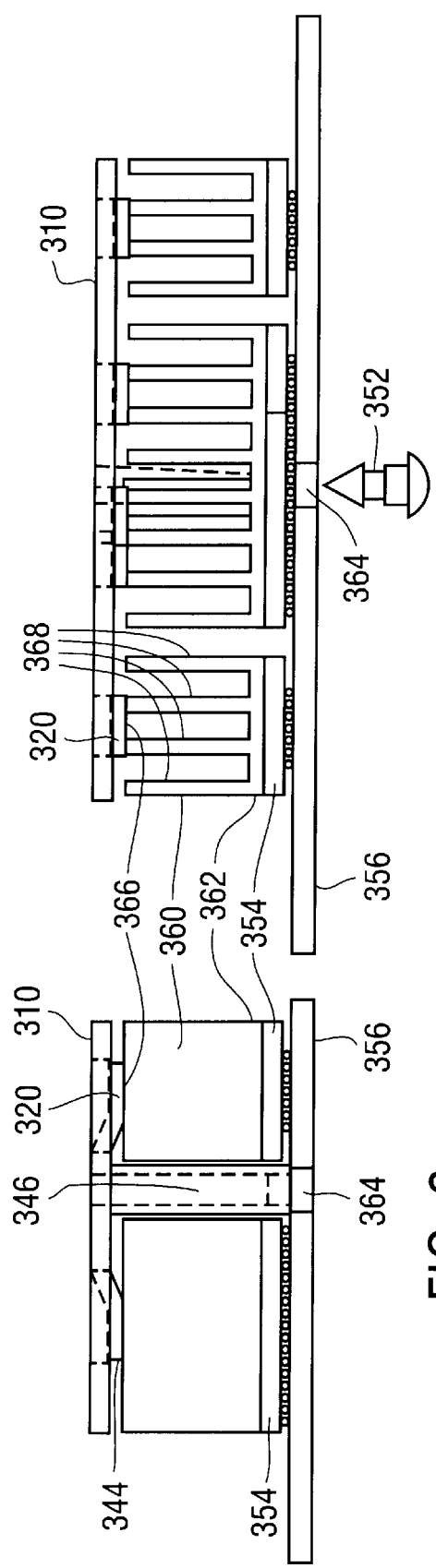

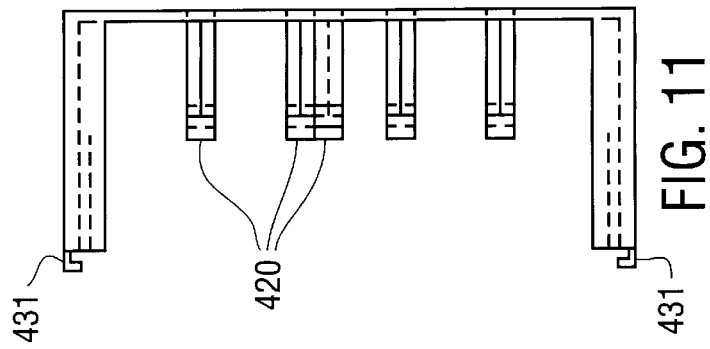
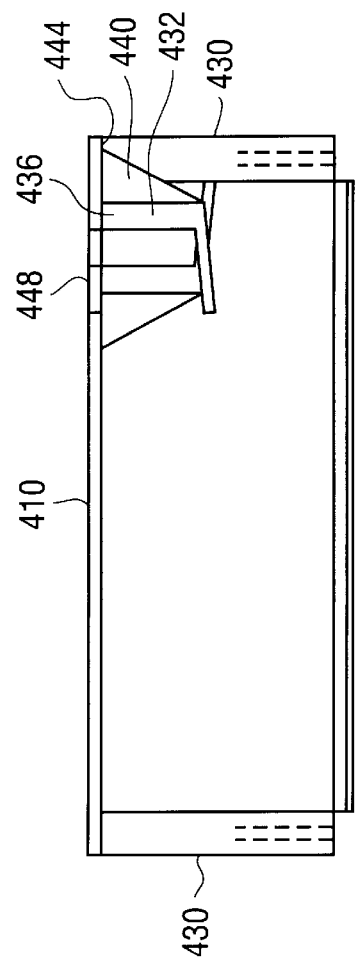
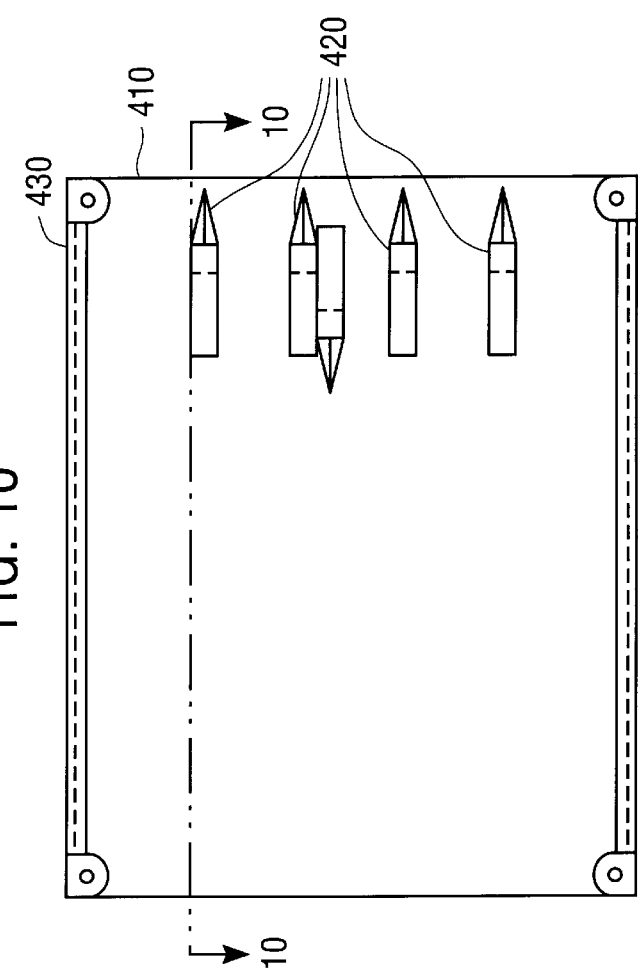

METHOD AND APPARATUS TO IMPROVE THE THERMAL INTERFACE BETWEEN A HEAT SINK AND A SEMICONDUCTOR

BRIEF DESCRIPTION OF THE INVENTION

Generally, this invention relates to the removal of heat from the surface of a semiconductor. More particularly, this invention relates to a method and apparatus to improve the thermal interface between a heat sink and a semiconductor.

BACKGROUND OF THE INVENTION

As semiconductors continue to decrease in size while power densities increase, heat dissipation problems must continue to be resolved. Typically, heat sinks are used to cool semiconductors. Semiconductors can use ceramic or plastic packages. Heat sinks are very difficult to attach to plastic packages. Adhesives do not stick very well, and mechanical attachment is expensive. Some mechanical attachment methods can damage the semiconductor package.

One prior art method uses double sided thermal adhesive tape to attach heat sinks to the plastic packages. An external device provides additional support and protection to the heat sinks. This device is a piece of molded plastic that fits over the top of the heat sinks and is attached to the circuit board with screws. A piece of thin foam rubber is attached to the device over the location of the heat sinks. The foam rubber applies even pressure to the top of the heat sinks and compensates for height tolerance problems.

However, this approach is time consuming and expensive. Labor is needed to attach the foam rubber to the device and the foam rubber adds to the cost.

Therefore, it would be highly desirable to reduce the cost and labor associated with installing heat dissipation devices for semiconductor devices.

In addition, the double sided tape may weaken with age. If the heat sinks are not handled properly, then the loss of the mechanical strength of the tape will increase the thermal impedance at the thermal interface between the heat sink and the semiconductor package.

Therefore, it would be highly desirable to improve the thermal interface of the heat sink and semiconductor package by improving the mechanical strength at the thermal interface.

SUMMARY OF THE INVENTION

An apparatus to improve the thermal interface between a heat sink and a semiconductor comprises a support member attached to a bias plate. The support member facilitates a fixed connection with a surface. The bias plate has a beam for alignment with a heat sink that is attached to the semiconductor. The bias plate is attached to the support member such that the support member forces the beam against the heat sink to improve the thermal interface between the heat sink and the semiconductor.

The bias plate of the present invention is used in a computer. The computer has a semiconductor attached to a circuit board. A heat sink is attached to the semiconductor. The bias plate includes a beam for alignment with the heat sink. The bias plate is positioned such that the beam is forced against the heat sink to improve the thermal interface between the heat sink and the semiconductor.

A method improves the thermal performance of a semiconductor by attaching a heat sink to a semiconductor, and biasing a pivoting beam against the heat sink such that the heat sink achieves an improved thermal interface with the semiconductor.

This invention is more cost effective because it eliminates the foam rubber and the labor of attaching the foam. The function of the foam rubber is now supplied by a beam that is molded into the bias plate to apply the appropriate pressure to the heat sinks. The bias plate can be manufactured at a very low cost, for example, by injection molding.

BRIEF DESCRIPTION OF THE DRAWINGS

For a better understanding of the invention, reference should be made to the following detailed description taken in conjunction with the accompanying drawings, in which:

FIG. 3 is a top view of a bias plate in accordance with a first embodiment of the invention.

FIG. 4 is a side, end view of a bias plate and support member in accordance with an embodiment of the invention.

FIG. 5 is a side, axial view of the bias plate and support member in accordance with an embodiment of the invention.

FIG. 6 is a side, end view of the bias plate and support member of FIG. 4 when used with a semiconductor and heat sink.

FIG. 7 is a side, axial view of the bias plate and support member of FIG. 5 when used with a semiconductor and heat sink.

FIG. 9 is a bottom view of a bias plate in accordance with a second embodiment of the invention.

FIG. 10 is a side, axial view of the bias plate and support member of FIG. 9 along line A—A.

FIG. 11 is a side, end view of the bias plate and support member of FIG. 9.

Like reference numerals refer to corresponding parts throughout the drawings.

DETAILED DESCRIPTION OF THE INVENTION

Figure 1:
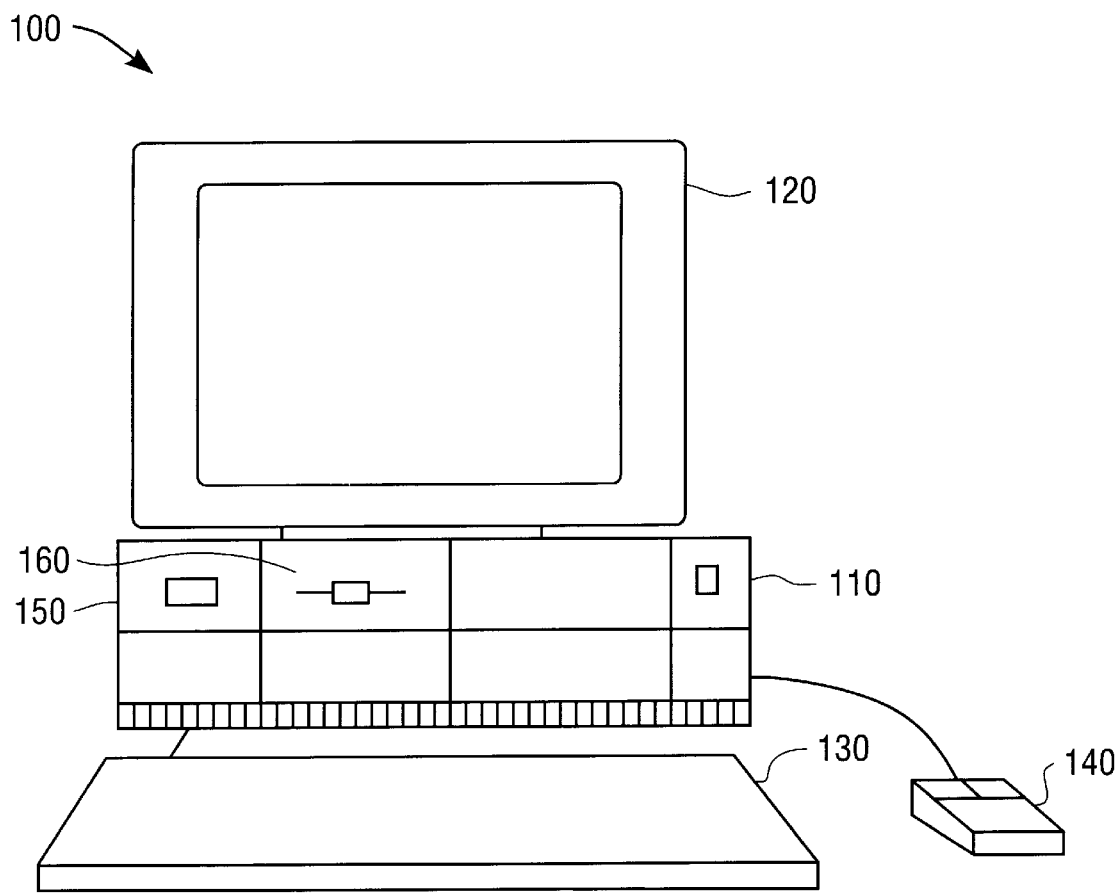
FIG. 1 is a front view of a computer suitable for use with the present invention.

FIG. 1 is a computer system 100 suitable for use with the present invention. The computer system 100 has the following components: a computer housing 110, display 120, keyboard 130, mouse 140, hard disk drive 150, and floppy disk drive 160.

Figure 2:
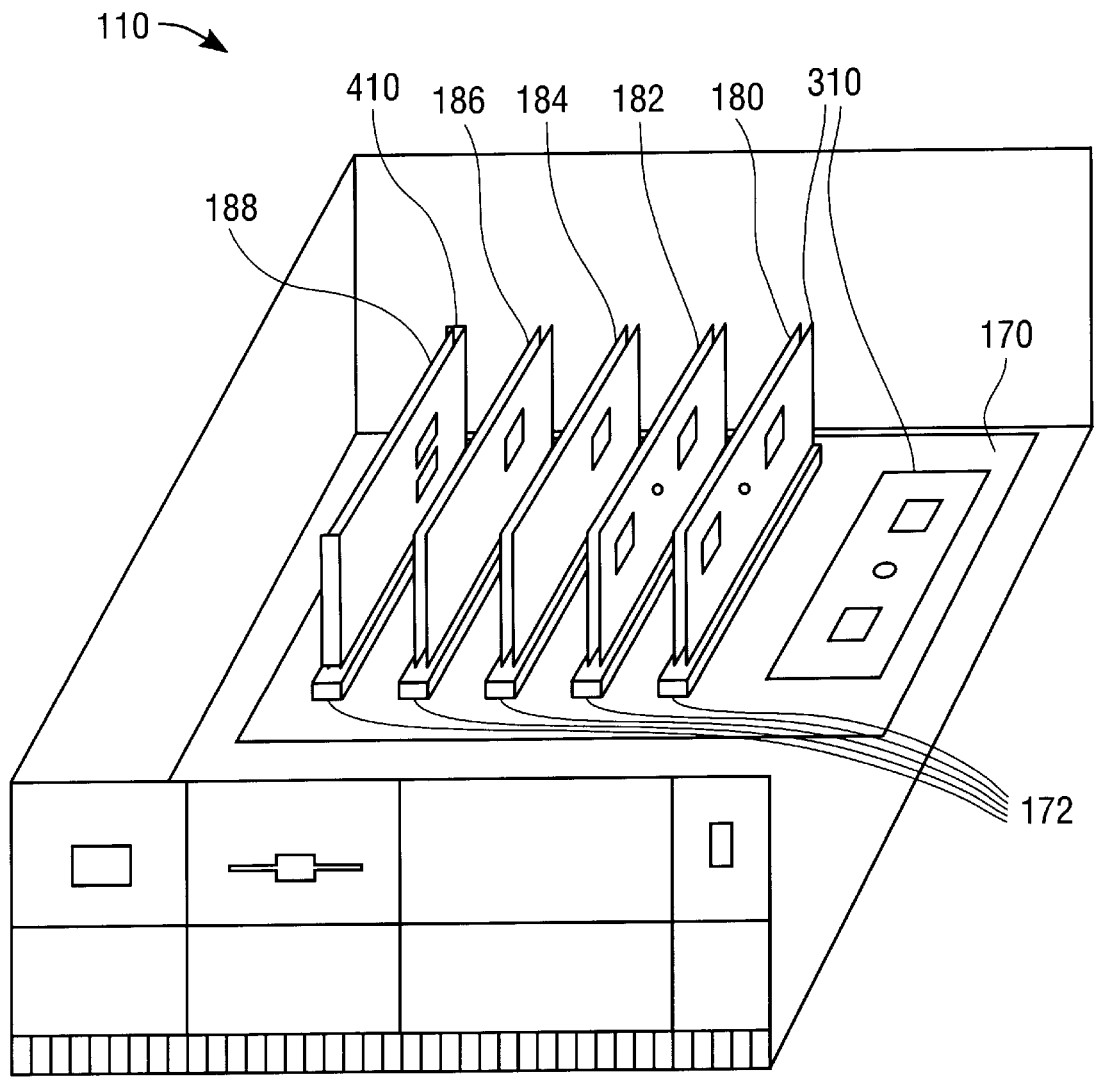
FIG. 2 is a perspective view of the interior of the computer of FIG. 1 showing circuit boards using the heat sink support of the present invention.

FIG. 2 is the interior of the computer housing 110 of FIG. 1 showing circuit boards using the heat sink support of the present invention. The computer housing 110 comprises a mother board 170 with connectors 172 for supporting and connecting to circuit boards 180–188.

FIG. 3 is a top view of a bias plate 310 in accordance with a first embodiment of the invention. The bias plate 310 has a set of beams 320. The bias plate 310 is integrally formed with or connected to a support member 330. The support member 330 facilitates a fixed connection with a surface.

As used herein, the term "bias" means to apply a force. The term "bias plate" is used because beam members of the bias plate are used to apply a force to the heat sink against the semiconductor.

FIG. 4 is a side, end view of the bias plate 310 and support member 330. In this view, the structure of the beams 320 can be seen. A first beam end 332 attaches to the bias plate 310 at a bias plate pivot point 334. A second beam end 336 is unattached. Referring to FIGS. 3 and 4, a gap 338 is shown between the second beam end 336 and the bias plate 310. When engaged with a heat sink, the beam 320 can flex or pivot at the bias plate pivot point 334, allowing the beam 320 to pass through the gap 338. Thus, the beam 320 is flexible. The flexing action of the beam 320 exerts a force on a heat sink positioned beneath it, as described below.

In a preferred embodiment, the beam 320 has two components: a sloped member 342 attached to a contact member 344. The sloped member 342 attaches the beam 320 to the bias plate 310.

FIG. 5 is a side, axial view of a bias plate 310 and support member 330 in accordance with an embodiment of the invention. The support member 330 is a pillar and has a cylindrical opening 346 at its base for accepting a fastener 352. The fastener 352 can be a snap-fit fastener or a screw.

FIG. 6 is a side, end view of the bias plate 310 and support member 330 of FIG. 4 when used with a semiconductor and heat sink. Semiconductors 354 are attached to a circuit board 356. As used herein, the term semiconductor refers to a semiconductor and/or the housing in which it is positioned. The heat sinks 360 have a lower contact surface 362 that is attached to the semiconductor 354, for example, with double sided thermal adhesive tape (not shown). The opening 346 in the support member 330 is aligned with an opening 364 in the circuit board 356. The beam's 320 contact member 344 also has a contact surface 366 for engaging the heat sink 360. The beam's 320 contact surface 366 applies substantially uniform pressure to the heat sink 360 and therefore to the semiconductor 354.

FIG. 7 is a side, axial view of the heat sink support of FIG. 5 when used with a semiconductor and heat sink. The heat sinks 360 have fins 368 and the bias plate 310 fits over the fins 368. A fastener 352 is inserted through the openings 364 and 346 to attach the bias plate 310 to the circuit board 356. The beams 320 are arranged on the bias plate 310 to engage the fins 368 such that a substantially uniform pressure is applied to the surface of the semiconductor 354.

When engaged, the beam 320 is biased against the heat sink such that the heat sink improves the thermal interface with the semiconductor. To engage the heat sinks, when properly inserted the fastener 352 applies a sufficient force to properly bias the beam 320.

Figure 8:
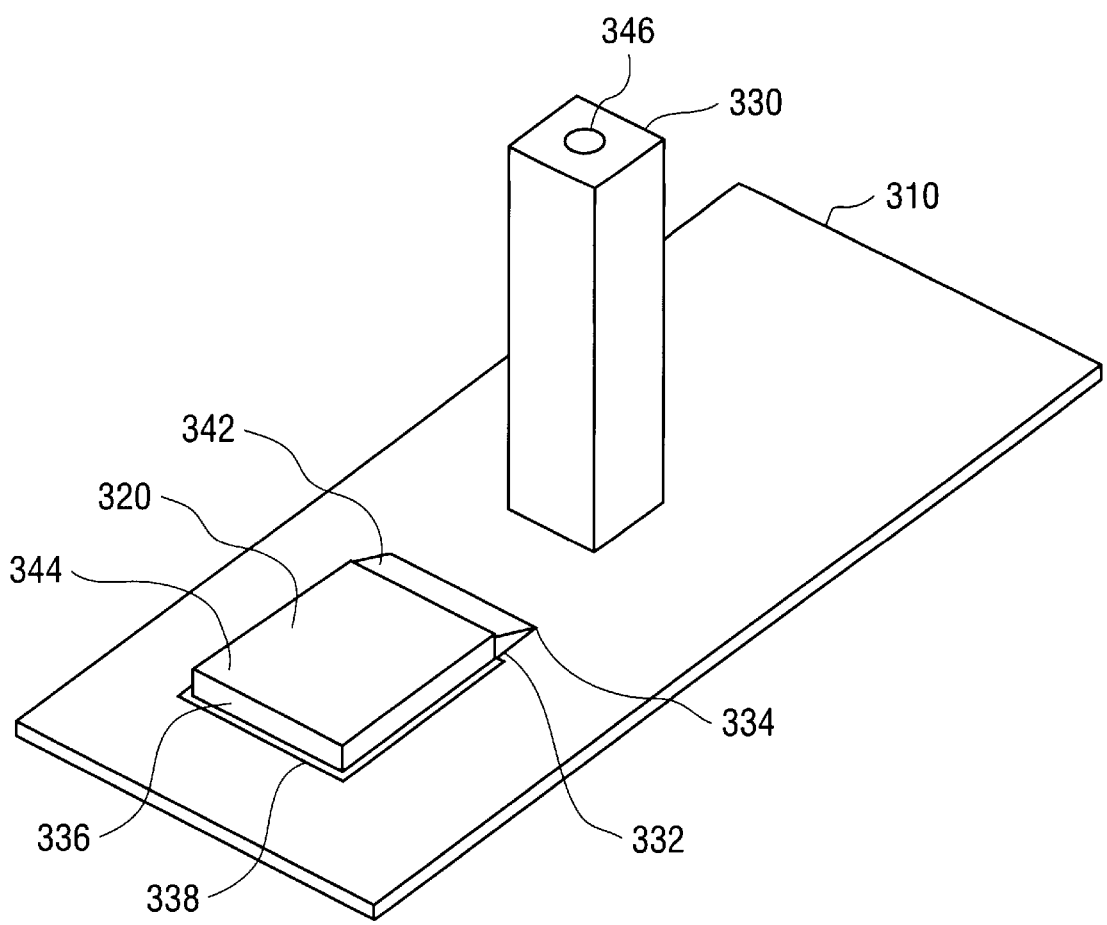
FIG. 8 is a perspective view of the bottom of a bias plate with a single beam, in accordance with an embodiment of the invention.

FIG. 8 is a perspective view of the bottom of a bias plate with a single beam, in accordance with an embodiment of the invention. FIG. 8 shows the gap 338 between bias plate 310 and the beam 320 extending along the back and side of the beam 320.

FIG. 9 is a bottom view of a bias plate 410 in a second embodiment of the invention. The bias plate 410 has a set of beams 420 and support members 430.

FIG. 10 is a side, axial view of the bias plate 410 and support member 430 of FIG. 9 along line A—A. The bias plate 410 has support members 430. In this embodiment, the support members 430 are rails disposed on opposite sides of the bias plate 410.

FIG. 11 is a side, end view of the bias plate and support member of FIG. 9. The rails have clips 431 for attaching the bias plate 410 to a circuit board.

Figure 12:
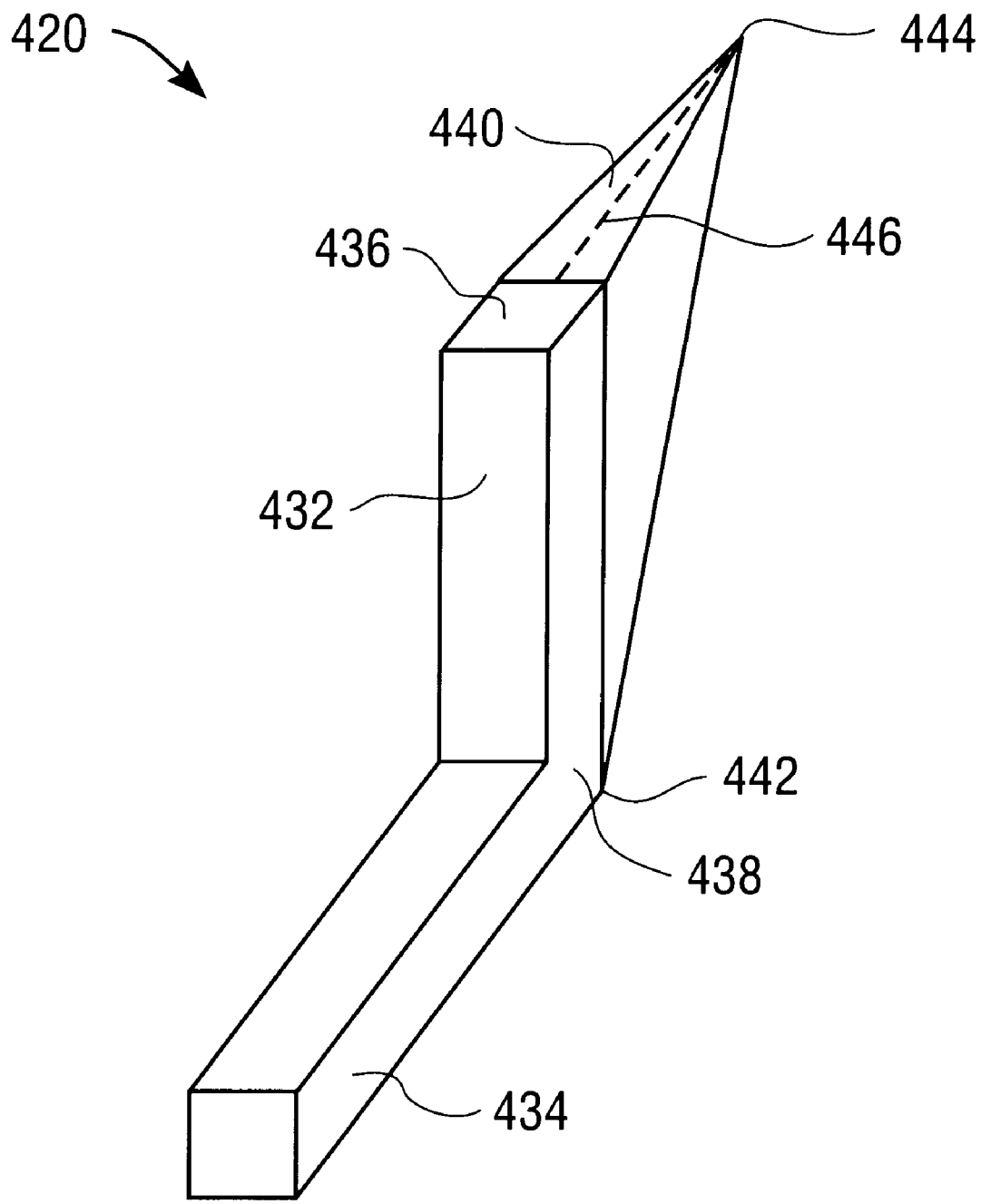
FIG. 12 is a perspective view of the beam used with the bias plate of FIGS. 9, 10 and 11.

FIG. 12 is a perspective view of the beam 420 used with the bias plate 410 of FIGS. 9, 10 and 11. In this second embodiment, the beam 420 has an arm 432 and a contacting member 434. The arm 432 has a first end 436 and a second end 438. Referring also to FIG. 10, the first end 436 of the arm 432 is attached to and is substantially perpendicular to the bias plate 410. The second end 438 of the arm 432 is attached to the contacting member 434. A lateral support member 440 is attached to the beam 420 and the bias plate 410. The lateral support member 440 attaches to a side of the arm 432 and has a wedge shape—extending from a pivot point 442 at the second end 438 of the arm 432 to a distant point 444 on the bias plate 410. The wedge-shape has lower air resistance. Alternately, the lateral support member 440 can use other shapes.

Preferably, the distant point 444 on the bias plate 410 is aligned with a central axis 446 extending through the beam and arm. Therefore the wedge is symmetrical along the central axis 446. The lateral support member 440 provides additional support to the beam 420 to ensure that the arm 436 does not move in a direction away from the semiconductor when engaged with the heat sink. In other words, the lateral support member 440 ensures that the beam 420 is properly positioned when engaged with the heat sink.

When engaged with the heat sink, the contacting member 434 is substantially parallel to the bias plate 410. The contacting member 434 flexes about the pivot point 442. In other words, the beam 430 acts like a spring to apply pressure to the heat sink.

When the clips 431 (shown in FIG. 11) are engaged with a circuit board, the beam 420 is biased against a heat sink. The beams 420 apply a sufficient additional force to the fins of the heat sink to improve the thermal interface between the heat sink and the semiconductor.

Preferably, for both embodiments, the bias plate, support members and beams are formed of injection molded plastic. Alternately, for both embodiments, the bias plate, support members and beams are a stamped metal plate.

Referring back to FIG. 2, both embodiments of the present invention are shown attached to circuit boards 180, 182, 184, 186, and 188 in vertical slots 172 in the processing unit 110. The bias plate of the first embodiment 310 is attached to a circuit board 180 that is in one vertical slot 172. The bias plate of the second embodiment 410 is attached to another circuit board 188 that is in another vertical slot 172. Another bias plate of the first embodiment 310 is attached to the mother board 170. Alternatively the bias plate the second embodiment 410 can be attached to the mother board 170.

ALTERNATIVE EMBODIMENTS

In an alternative embodiment, the beam 320 of the first embodiment is used with the support 430 and clips 431 of the second embodiment. In another alternative embodiment, the beam 420 of the second embodiment is used with the pillar support member 330 of the first embodiment.

Although the invention was described using a single pillar 330, in alternate embodiments two or more pillars can be used.

Preferably, the beams 320, 420 have a smooth surface that contacts the fins. In alternative embodiments, the beams have a rough or textured surface.

To accommodate for height tolerance problems of a heat sink, multiple beams, of either embodiment 320, 420, can be used to apply pressure to the heat sink. In other words, multiple beams of the first embodiment 320 can be used to apply pressure to a heat sink. Alternatively, multiple beams of the second embodiment 420 can be used to apply pressure to a heat sink.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

In the claims:

1. An apparatus to improve the thermal interface between a heat sink and a semiconductor, comprising:

a support member to facilitate a connection with a surface; and a bias plate including a beam for alignment with a heat sink which is attached to a semiconductor, said bias plate being attached to said support member, a portion of said beam being detached from said bias plate, said beam having a sloped member attached to a contact member, at least a portion of said contact member being detached from said bias plate such that an end of said contact member is free, at least a portion of said contact member to contact said heat sink, such that said support member forces said contact member against said heat sink to improve the thermal interface between said heat sink and said semiconductor.

2. The apparatus of claim 1 wherein said beam is flexible.

3. The apparatus of claim 1 wherein said sloped member is attached to said bias plate at a bias plate pivot point.

4. The apparatus of claim 1 wherein said bias plate and beam are integrally formed from a material selected from the group comprising plastic and metal.

5. The apparatus of claim 4 wherein said bias plate and beam are formed of injected molded plastic.

6. An apparatus to improve the thermal interface between a heat sink and a semiconductor, comprising:

a support member to facilitate a connection with a surface; and a bias plate including a beam for alignment with a heat sink which is attached to a semiconductor, said bias plate being attached to said support member, a portion of said beam being detached from said bias plate, said beam having a first beam end and a second beam end, said first beam end being attached to said bias plate at a bias plate pivot point, said bias plate also including a lateral support member, said first beam end being attached to said lateral support member at said bias plate pivot point, said beam also having a contact member, at least a portion of said contact member being detached from said bias plate such that an end of said contact member is free, at least a portion of said contact member to contact said heat sink, such that said support member forces said contact member against said heat sink to improve the thermal interface between said heat sink and said semiconductor.

7. The apparatus of claim 6 wherein said lateral support member is wedge shaped.

8. The apparatus of claim 1 wherein said support member is a pillar attached to said bias plate.

9. The apparatus of claim 1 wherein said support member is a clip attached to said bias plate.

10. A computer comprising:

a circuit board;

a semiconductor attached to said circuit board;

a heat sink attached to said semiconductor;

a support member attached to said circuit board; and a bias plate attached to said support member, said bias plate including a beam for alignment with said heat sink, a portion of said beam being detached from said bias plate, said bias plate being positioned such that said beam is forced against said heat sink to improve the thermal interface between said heat sink and said semiconductor.

11. The apparatus of claim 10 wherein said beam is flexible.

12. The apparatus of claim 10 wherein said beam includes a first beam end and a second beam end, said first beam end being attached to said bias plate at a bias plate pivot point.

13. The apparatus of claim 12 further comprising a lateral support member, said first beam end being attached to said lateral support member at said bias plate pivot point.

14. The apparatus of claim 13 where in said lateral support member is wedge shaped.

15. The apparatus of claim 10 wherein said support member is a pillar attached to said bias plate.

16. The apparatus of claim 10 wherein said support member is a clip attached to said bias plate.

* * * * *